US005537039A

United States Patent [19]

Le Roux et al.

[11] Patent Number: 5,537,039
[45] Date of Patent: Jul. 16, 1996

[54] VIRTUAL FREQUENCY ENCODING OF ACQUIRED NMR IMAGE DATA

[75] Inventors: Patrick L. Le Roux, Palaiseau, France; Yi Sun, Waukesha, Wis.

[73] Assignee: General Electric Company, Milwaukee, Wis.

[21] Appl. No.: 541,545

[22] Filed: Oct. 10, 1995

[51] Int. Cl.[6] ........................................ G01V 3/00
[52] U.S. Cl. ............................. 324/309; 324/307
[58] Field of Search ........................ 324/300, 303, 324/307, 309, 310, 311, 312, 313, 314, 318, 322; 128/653.1, 653.2, 653.8

[56] References Cited

U.S. PATENT DOCUMENTS 4,857,846  8/1989  Carlson ........................... 324/309
4,970,457  11/1990  Kaufman et al. ................ 324/309
5,157,330  10/1992  Kaufman et al. ................ 324/318
5,168,228  12/1992  Mansfield et al. .............. 324/309

Primary Examiner—Michael Tokar
Attorney, Agent, or Firm—Quarles & Brady

[57] ABSTRACT

Slabs are selected using a combination of a slab select gradient and selective RF excitation pulses to acquire 3D NMR data. Thinner 2D slices are selected within each slab by employing virtual frequency encoding of the acquired NMR signals. This encoding is achieved by stepping the value of the gradient in the slab select direction and concurrently changing the time interval between RF excitation and acquisition of the resulting NMR echo signal. A gradient recalled echo pulse sequence and a fast spin echo pulse sequence are described.

9 Claims, 3 Drawing Sheets

VIRTUAL FREQUENCY ENCODING OF ACQUIRED NMR IMAGE DATA

BACKGROUND OF THE INVENTION

The field of the invention is nuclear magnetic resonance imaging methods and systems. More particularly, the invention relates to the multi-slab acquisition of three-dimensional NMR image data.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One method for localizing the region from which NMR signals are acquired to produce an image is referred to in the art as the "slice select" or "slab select" technique. A magnetic field gradient is applied along an axis (e.g. z axis) and a selective RF excitation pulse is applied. The frequencies in the selective RF excitation pulse establish resonance with the spins to be excited at a location along the z axis where the sum of the polarizing magnet field $B_0$ and the applied gradient field $G_z$ satisfy the condition for Larmor resonance. If the polarizing magnetic field $B_0$ is homogeneous throughout the region to be imaged, and if the gradient field $G_z$ is perfectly formed, a flat slice, or slab, of spins will be excited. The location of the slice is determined by the center frequency of the selective RF excitation pulse, and its thickness is determined by its bandwidth. Such an ideal slice is shown in FIG. 2.

Because the polarizing magnetic field $B_0$ is not perfectly homogeneous, in practice the slice select method of spin excitation is less than perfect. Not only are there inhomogeneities in the generated polarizing field $B_0$, but when an object is placed in the field of view, susceptibility effects further distort the $B_0$ field, and chemical shift effects come into play. As a result, the excited slice no longer lies in a flat plane, but instead, lies in a complex, contoured plane such as that shown in FIG. 3.

In most MRI pulse sequences the distortion of the selected slice is not a significant problem. However, there are occasions when slice selection is used and then phase encoding is used along the same axis to further localize the acquired NMR signals. Since phase encoding is not dependent on the polarizing magnetic field $B_0$, the region it selects is not distorted by field inhomogeneities and it will not coincide with the shape of the selected slice.

Such a situation is illustrated in FIG. 4, where three-dimensional NMR data is acquired using a combination of slab selection along the z axis and phase encoding along the same axis. This method is described, for example, in U.S. Pat. No. 4,431,968 entitled "Method of Three-Dimensional NMR Imaging Using Selective Excitation", which is incorporated herein by reference. Due to $B_0$ field inhomogeneities, the three slabs 10, 11 and 12 are not flat, but instead, are distorted into a complex curved volume. A series of 3DFT acquisitions are made to acquire NMR image data from each excited slab 10–12, and because phase encoding is used to localize along the z axis, the 3D array of NMR data represents samples located in successive, planar slices 14 disposed along the z axis. At the boundaries between slabs 10, 11 and 12, the planar slices 14 of 3D data will not be confined to their excited slab due to the curved slab boundaries. This produces dark bands at the slab boundaries in the reconstructed 3D images, which is known in the art as the "venetian blind" artifact. This artifact is particularly troublesome at high polarizing field strengths and when fast spin echo pulse sequences are used to acquire the 3D NMR data.

SUMMARY OF THE INVENTION

The present invention is a method for acquiring NMR data from which an image can be reconstructed and in which the NMR data is frequency encoded along one image coordinate direction by acquiring NMR signals in the presence of a gradient field directed along that coordinate direction, and the NMR data is effectively frequency encoded along a second image coordinate direction by shifting the relative timing of the acquisition of the NMR signals each time a phase encoding gradient field directed along the second image coordinate direction is stepped in value. The shift in relative timing may be achieved either by changing the time at which the NMR signal is acquired during the imaging pulse sequence, or by changing the timing of the RF pulse that produces the transverse magnetization.

A general object of the invention is to locate spins within a slab of spins excited by a selective RF pulse and slab select gradient. By stepping a phase encoding gradient directed along the same axis as the slab select gradient and concurrently shifting the relative timing of the acquired NMR signals, signal producing spins are located within the slab along the slab select axis. Any anomalies in the shape of the selected slab due to polarizing field inhomogeneity are precisely matched by the "virtual" frequency encoding method of locating spins within the slab.

Another object of the invention is to suppress image artifacts in 3D images due to inconsistencies in the slab select method of spin localization and the phase encoding method of locating spins in the slab. By employing virtual frequency encoding along the slab select axis, the shape of the 3D array of acquired NMR data precisely matches the shape of the excited slab. As a result, the NMR signals at the boundaries of the slab accurately reflect the magnetic response of excited spins, and dark regions in the reconstructed images are eliminated.

GENERAL DESCRIPTION OF THE INVENTION

Figure 1:
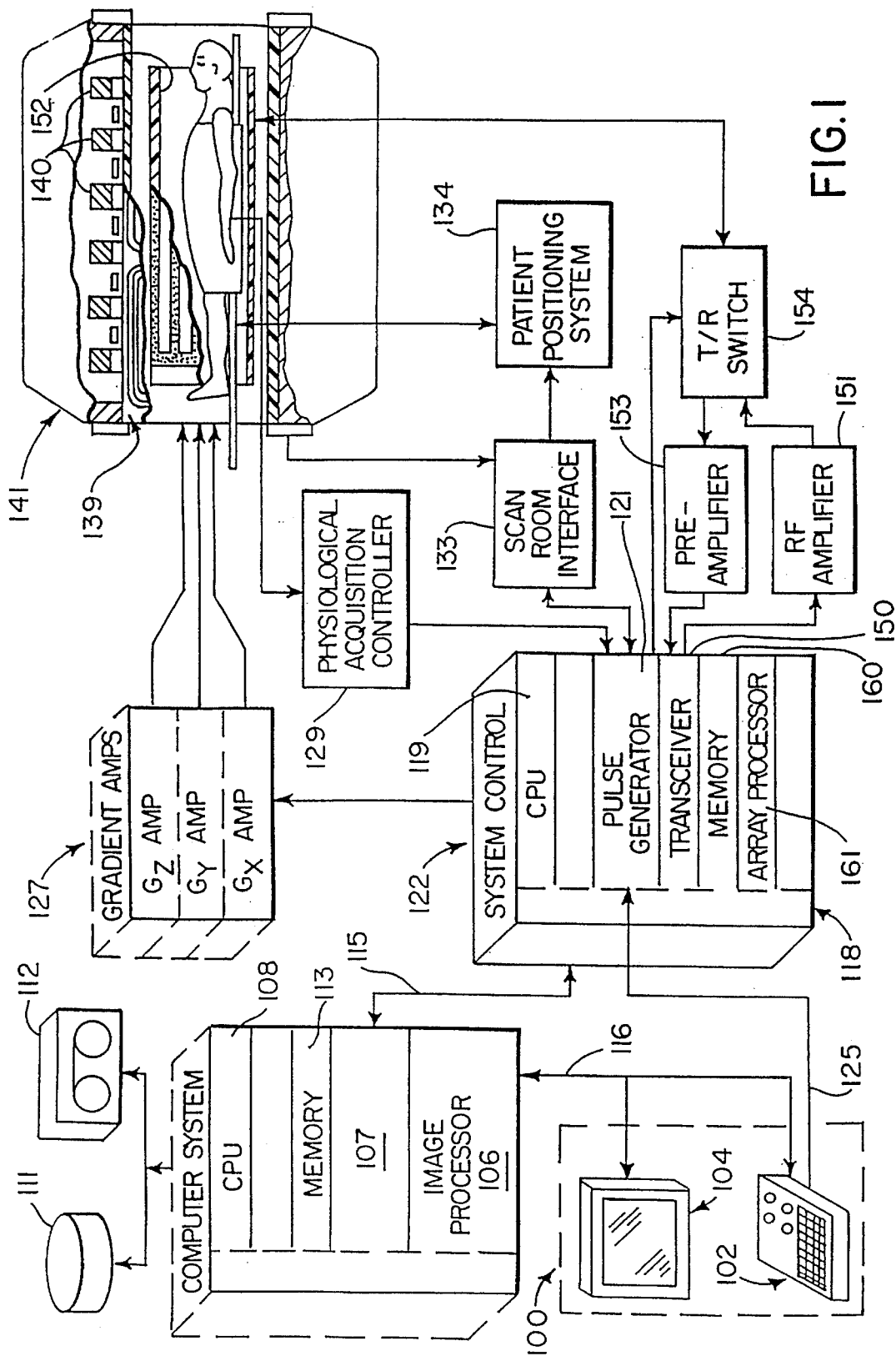
FIG. 1 is a block diagram of an MRI system which employs the present invention.
Figure 2:
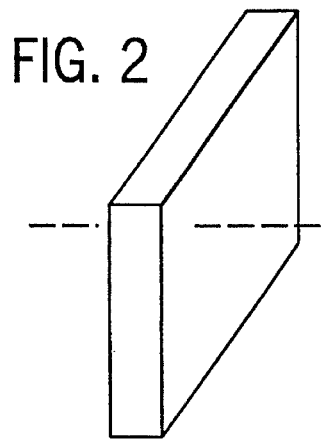
FIG. 2 is a pictorial representation of slice selected under ideal operating conditions.
Figure 3:
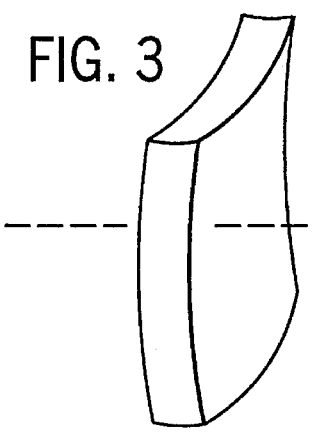
FIG. 3 is a pictorial representation of a slice selected in a in-homogeneous polarizing magnetic field.
Figure 4:
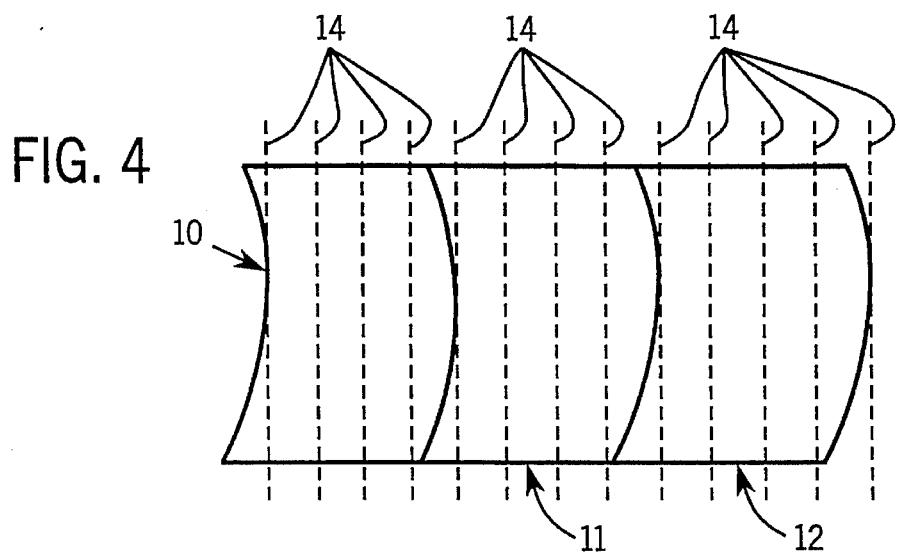
FIG. 4 is a pictorial representation of a multislab acquired set of three-dimensional NMR image data without the present invention.

Imaging procedures use selective RF pulses to define a slice in 2D imaging, or a slab in 3D or 3D multi-slabs. The process of acquisition-reconstruction by Fourier Transform gives a result $M_0(\vec{X})$ which does not present the density of the object, but the density multiplied by the profile(s) of the RF pulse(s) $R(\vec{X})$.

$$M_0(\vec{X}) = \rho(\vec{X})R(\vec{X})$$

The introduction of this multiplication by the RF profile may seem without consequence on the imaging process and one would tend to consider them as two independent operations; but this is false. For an RF pulse to be selective in Z, the selective RF waveform is played in the presence of a gradient field $G_sZ$. The response of the protons during an RF pulse is only dependent on the RF waveform $B_1(t)$ and of its resonant frequency during the pulse. Differently stated, all the protons at the same resonant frequency will undergo the same action. Thus the profile $R(\vec{X})$ is only a function of the resonant frequency $f_s$ during the pulse. The resonant frequency is in turn determined by the selection gradient field $G_sZ$ plus the local $B_0$ inhomogeneity:

$$R(\vec{X}) = R(f_s) = R\left(\frac{\gamma}{2\pi}[\Delta B_0(\vec{X}) + G_sZ]\right) = R\left(\frac{\gamma}{2\pi}G_sS\right) \quad (1)$$

$$S = \frac{\Delta B_0(\vec{X})}{G_s} + Z$$

Where we define another coordinate S (physical dimension is a distance). A constant value S corresponds to a constant value of the resonant frequency during the selection and defines a 2D surface that we may call equi-selection frequency (or equi-S). In general, except if $\Delta B_0$ is null or the selection gradient $G_s$ is very high, an equi-S is not a plane Z=cte.

The curvature of the equi-S is not of much importance for 2D imaging. The projection parallel to the Z direction is imaged onto an X, Y plane, of the repartition of $\rho$ contained between the two iso-S $S=S_0-\sigma/2, S=S_0+\sigma/2$, with $\sigma$ the slice thickness. If the normal to the surface $S=S_0$ does not make too large an angle with the Z axis, the geometric and amplitude distortion of the reconstructed image is negligible. In 3D however, the effect can be dramatic, because it is not the angle of the normal which intervenes but the variation in elevation Z of the surface $S_0$. The action on the imaging process which was of second order (in $\Delta B_0$) for 2D imaging becomes of the first order in 3D imaging.

Consider an equi-S with value $S_0$. We would like to know the elevation Z of any point on the surface $S_0$. This is almost an impossible task, as this requires the knowledge of $\Delta B_0(\vec{X})$ and the inversion of equation (1) to be able to write $Z=f(S_0,X,Y)$. But the range of variation of Z, noted $\Delta Z$ is accessible to us if the range of variation of the inhomogeneity is known:

$$S_0 = Z + \Delta B_0(X,Y,Z,)/G_s = cte$$

$$\frac{\min(\Delta B_0)}{G_s} < \Delta Z < \frac{\max(\Delta B_0)}{G_s}$$

The problem comes from the fact that the Fourier transformation reconstructs the object along the coordinate Z, not S. Encoding along Z over a field of view $L_z$, requires a step of the encoding gradient integral, multiplied by $\gamma$:

$$\delta k_z = 2\pi/L_z = \gamma \int_{\text{encoding period}} \delta G_z(r)dr$$

For example, if $L_z$ is equal to the FWHM of the selected slab, $N_3$ encoding steps permits reconstruction of $N_3$ slices with the desired resolution (the slice thickness) $\sigma=L_z/N_3$. From the set of $N_3$ acquired slices, only $N_{kpt}$ slices belong to the flat portion of the slab profile and are used for the visualization. Let the extent of this flat portion be noted by $l_z$, $l_z=N_{kpt}\sigma$. Then a 3D multislabs acquisition will cover all the space by acquiring several slabs separate from each other by $l_z$.

The heart of the problem lies in the fact we use two separate process to finally isolate a slice: one RF selection, followed by a phase encoding, each one defining two different coordinates S and Z of the space. We have to reconciliate these two coordinates and make them equal. We first look a the solution for a gradient recalled echo (GRE) pulse sequence and than a fast spin echo (FSE) pulse sequence.

There is in the GRE pulse sequence a reference time, which determines the time at which a "snapshot" of $M_0(\vec{X})$ is taken. For classical GRE this is what is called the echo time, but for reasons which will become clear, we call it more generally reference time. We define more generally the reference time as: the time which is linked rigidly to the sampling train and to the read gradient; and the time (if no phase encoding is performed) at which the integral of the gradient X is nulled.

Consequently, at the reference time, if no encoding is applied, the only remaining phase term is due to $\Delta B_0$ and is $\Delta B_0(\vec{X})T_e$ ($T_e$ is the position of the reference time away from the flip pulse center when no phase encoding is performed). This is a constant that will be included in the phase of the reconstructed image $M_0(\vec{X})$.

The phase encoding gradient changes the phase of the magnetization at the reference time according to a predetermine law, for instance, linear as a function of the signal acquisition order $(n_2, n_3)$.

$$d\psi(\vec{X},n_2,n_3) = Y(n_2 \times \delta k_y) + Z(n_3 \times \delta k_z)$$

Where $\delta k_y$, $\delta k_z$ are the time integral, multiplied by $\gamma$ of the incremental encoding lobes. To have the third coordinate Z of the reconstructed image coincide with the coordinate S, we change Z into S, in the term containing $\delta k_z$:

$$d\phi(\vec{X}, n_3) = \left( \frac{\gamma \Delta B_0(\vec{X})}{G_s} + Z \right) (n_3 \times \delta k_z)$$

which is more enlightening to rewrite as:

$$d\phi(\vec{X}, n_3) = \gamma \Delta B_0(\vec{X}) (n_3 \times \delta T) + Z (n_3 \times \delta k_z) \quad (2)$$

$$\delta T = \frac{\delta k_z}{\gamma G_s}$$

$\delta T$ has the physical dimension of time, as its name suggests. Physically it represents the time necessary to generate a wavenumber increment $\delta k_z$ with a constant gradient of amplitude $G_s$. Or, otherwise stated, it is the time necessary to dephase by $2\pi$ the protons situated at the two edges of the FOV (along Z) with a constant gradient $G_s$. Similarly, $T=N_3\times\delta T$ is the time necessary to dephase by $2\pi$ two protons separated by the desired resolution (the slice thickness) with a constant gradient $G_s$.

Taking equation (2) one modifies the pulse sequence such that at the reference point, in addition to the normal gradient encoding $n_3\delta k_z$ the magnetization will undergo the dephasing due to $\Delta B_0$ during a time $n_3\delta T$. This is done, naively, by shifting the reference point (along with the sampling train and the read gradient) by $n_3\times\delta T$. Of course a dead time T/2 must be added between the end of encodings and the beginning of the signal sampling to accommodate the variable time. One can also rewrite equation (2) completely in terms of $n_3\times\delta T$:

$$d\psi(\vec{X},n_3)=\gamma(\Delta B_0(\vec{X})+G_sZ)(n_3\times\delta T) \quad (3)$$

which indicates that the selection period itself may be used for encoding by a variable time. In practice this means suppress all the encoding lobes on the third direction, and increase the flat portion of the selection gradient by T/2 on each side of the RF pulse. In consequence one adjusts the rephasing lobe to compensate for the increase $$\gamma G_s \frac{T}{2} s$$

of the phase during the RF pulse. Then to encode one shifts the position of the center of the RF pulse, in its augmented selection gradient window, by $(-n_3\times\delta T)$, creating the phase expressed by equation (3).

This solution is preferable to the first one because the sequence pertaining to the gradient waveform stays constant for all signal acquisition, only the RF pulse moves back and forth. As a result, little or no eddy currents variation occurs.

The fast spin echo pulse sequence includes several zero-phase points: the center of the flip pulse, and all the $(\Delta B_0)$ echo times (i.e. the position midway between two refocusing pulses). One can also attach to each read period, composed of a signal sampling train and a constant read gradient $G_r$, a reference point. We place this reference point, when no encoding is performed (nominal sequence), in concordance with the zero-phase point of the corresponding echo. When applied to the RF pulse sequence, a solution must maintain the CPMG condition.

The dephasing of one proton between the center of two successive refocusing pulses must be double the dephasing it experiences between the center of the flip-pulse and the center of the first refocusing pulse. The phase of the flip-pulse must be, for all selection resonance frequencies, in phase quadrature to the refocusing pulses which are themselves in phase.

The consequence of the CPMG condition on the time integrals of the gradients are as follows. All gradient integrals, or inhomogeneity integral, values between the center of two refocusing pulses must be exactly the double of their respective value between the center of the flip-pulse and the center of the first refocusing pulse.

The first solution for the FSE pulse sequence is a direct extension of the solution for the gradient recalled echo sequence. Consider each echo separately. We have a zero-phase point, the $\Delta B_0$ echo time. We have also a reference point on the sampling train and read gradient. Apart from that change in definition of the zero-phase point, the same reasoning as applied for the GRE pulse sequence and equation (2) is still completely valid.

To implement this solution, do not change the RF or any encoding lobe, just take the read portion of each echo (the reference point) and move it back and forth away from the $\Delta B_0$ echo time by the value $n_3\times\delta T$. Of course the separation between each refocusing pulse is increased by T to be able to accommodate this shift of the read portion. The separation between the flip-pulse and the first refocusing pulse must also be increased by T/2 to maintain the CPMG condition on $\Delta B_0$. This is the only requirement for maintaining the CPMG condition because the gradient integral values between the RF pulses have not been changed.

By extension, since no gradient integral is changed between the RF pulses for any shift of the read portion, one can also perform a different $k_z$ encoding for each echo (i.e. make $n_3$ vary from one echo to the next).

Another solution for the FSE pulse sequence employs constant encoding for all echoes. In this solution we first delete all Z phase encoding lobes. We increase the flat portion of the selection gradient on each side of the original RF pulse (flip pulse and refocusing pulses) by T/2, not forgetting to adapt the refocusing lobe of the $G_z$ gradient after the flip-pulse in order to keep a zero integral of $G_z$ at the end of the gradient refocusing period. To do this, we lengthen the minimum echo spacing by at least T. Then, to encode $(n_3\times\delta k_z)$, just move in block all the RF pulses by $-(n_3\times\delta T)$.

To check that this will not destroy the CPMG condition, and perform the desired third direction phase encoding, just cut the slab into infinitely small slices $S_0, S_0+dS$. The influence of the time-shift by $(n_3\times\delta T)$ of all the pulses is equivalent to changing the phase of the transverse magnetization at the end of the flip-pulse, by $(n_3\times\delta k_z)S_0$, and to rotating by the same amount the axis of all refocusing pulses at the same equi-$S_0$. Thus, looking in each slice $(S_0, S_0+dS)$, the CPMG condition is conserved, and the signals at echo times are rotated by the same phase $(n_3\times\delta k_z)S_0$ (i.e. we have the desired encoding along the third direction).

There are two kinds of CPMG conditions. The CPMG condition per se, where the 90° (flip-pulse) is in quadrature with a train of constant phase refocusing pulses. There is another one known as modified CPMG where the flip-pulse and the refocusing pulses are played on the same axis, but the sign of the refocusing pulse changes every other pulse. The modified CPMG sequence is the CPMG sequence but seen in a rotating frame which rotates by an angle $\pi$ between each refocusing pulse. This result is consistent with the CPMG condition, indeed looking at the spin in a rotating frame offsetted by $\delta f_0$, it is equivalent to adding a phase variation $\delta f_0 T_e/2$ between the flip-pulse and the first refocusing pulse and $\delta F_0 T_e$ between each refocusing pulses. They are in the ratio 1:2, and do not contradict the definition. Let us then use this other degree of freedom—the reference phase of each pulse may vary linearly as a function of the time position of their centers (this is equivalent to seeing the RF pulses in another rotating frame). As in the previous paragraph we create a linear phase variation across the slab selected by the flip-pulse (by shifting the pulse away from its nominal time position):

$$d\psi_{flip}(\vec{X}) = k_z^0 S \tag{4}$$

But, we take for the refocusing pulses (numbered i=1 . . . ) a reference phase varying as follows:

$$d\psi^i_{refoc}(\vec{X}) = (k_z^0 + (i - \tfrac{1}{2})\Delta K)S \tag{5}$$

(again by shifting each of the refocusing pulses by an appropriate time, different for each pulse). The CPMG condition is still fulfilled because the phase increment between the flip-pulse and the first refocusing pulse is $S\Delta K/2$ and the increment between each refocusing pulse is $S\Delta K$. The phase of the signal received at each echo (i=1 . . . ) is $$d\psi(\vec{X}, i) = (k_z^0 + i\Delta K)S \tag{6}$$

We have encoding along the third direction which is linearly variable as a function of the echo number, and the parameters $k_z^0$, and $\Delta K$ can be used to interleave in different manner the acquisition of the required $k_z$ values as is classically done on the direction Y in 2DFSE or 3DFSE.

Suppose that $k_z^0 = 0$, then the shift of the $i^{th}$ RF pulse is then:

$$\delta Y_s(i) = (i - 1/2)\left(\frac{\Delta K}{\gamma G_s}\right) = (i - 1/2)\Delta T \tag{7}$$

This corresponds to a CPMG train of RF with an echo spacing of $T_e + \Delta T$, where $T_e$ is the echo-spacing of the read periods (and all other gradients). Thus the RF train and the echo signals shift regularly ($\Delta T$ more at each echo) away from the center of the read-periods, giving the linearly variable encoding. One can add to that a coding corresponding to $k_z^0$ by time-shifting globally all the RF pulses as was done in the previous paragraph.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This Fourier transformation is performed along each k-space dimension of the acquired NMR data, which may be either two-dimensional or three-dimensional in most applications. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 5:
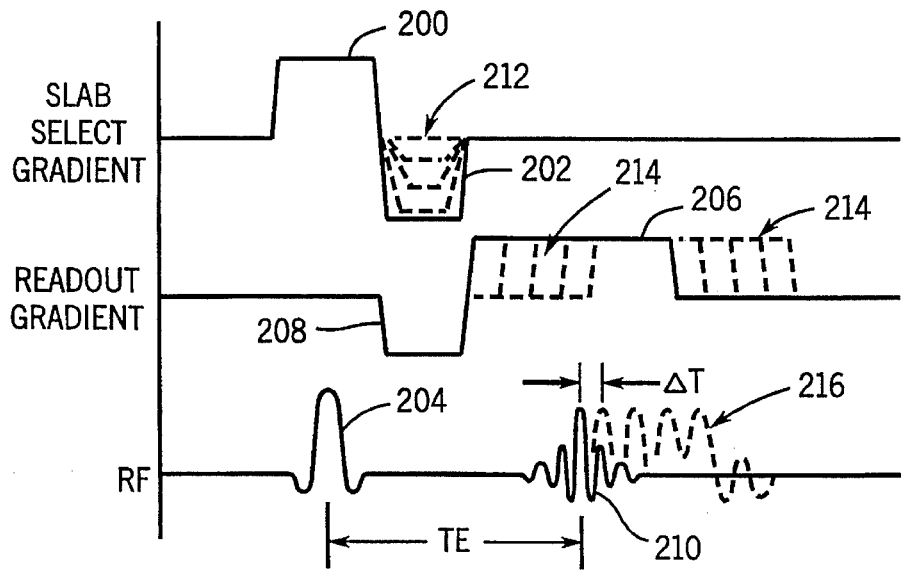
FIG. 5 is a graphic representation of a gradient recalled echo pulse sequence which practices one preferred embodiment of the invention.

The first embodiment of the invention employs the gradient recalled echo pulse sequence illustrated in FIG. 5. A description of a conventional gradient recalled echo pulse sequence is described in U.S. Pat. No. 4,707,658. This pulse sequence includes a slab select gradient pulse 200 which is followed by a rephasing pulse 202. In the preferred embodiment this gradient field ($G_z$) is directed along the z axis. As is well known in the art, absent phase encoding along the same axis the area of the negative rephasing pulse 202 is equal to one-half the area of the slab select pulse 200. A selective RF excitation pulse 204 is applied during application of the slab select pulse 200 and its bandwidth is set to excite spins in a slab (e.g. 8 mm thick) along the z axis.

The gradient recalled echo pulse sequence also includes a readout gradient pulse 206 which is applied immediately following the rephasing pulse 202. In the preferred embodiment the readout gradient ($G_x$) is directed along the x axis and the pulse 206 is preceded by a negative dephasing pulse 208. An NMR echo signal 210 is formed with its peak value occurring at the center of the readout gradient pulse 206. This NMR echo signal 210 is sampled to provide one line of NMR data (e.g. 256 samples) along the $k_x$ axis in k-space. This pulse sequence is performed repeatedly and a phase encoding gradient pulse ($G_y$) directed along the y axis (not shown in the drawings) is stepped through a corresponding series of values (e.g. 128 phase encodings) to scan k-space in the $k_y$ direction. As a result, a two-dimensional array of NMR data is acquired from which a single 2D slice image can be reconstructed.

A three-dimensional array of NMR data is acquired by repeating the above-described 2D scan with phase encoding applied along the slab select axis (i.e. z axis). As shown in FIG. 5, this is done to acquire five 2D slices at successive locations in the excited slab by stepping the rephasing gradient pulse 202 through five successive values indicated by dashed lines 212. Each step 212 in the z axis phase encoding moves the 2D acquisition in k-space along the $k_z$ axis, and at the completion of the scan a three-dimensional array of NMR data (e.g. 256×128×5) has been acquired from which five 2D slice images can be reconstructed. Under ideal measurement conditions, these five 2D images represent the NMR signals from five contiguous slices that precisely fill the excited slab.

Figure 7:
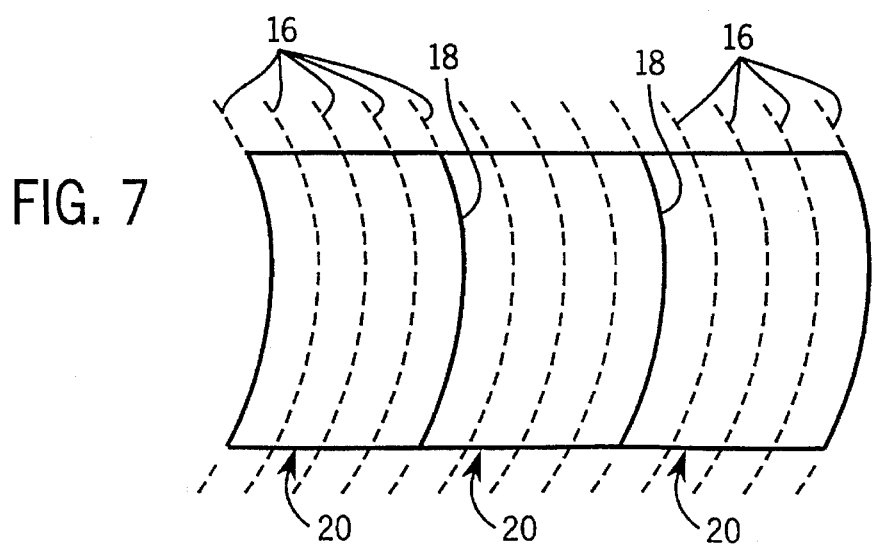
FIG. 7 is a pictorial representation of a multislab acquired set of three-dimensional NMR image data using the present invention.

As explained above, due to inhomogeneities in the polarizing magnetic field $B_0$, the shape of the excited slab may differ from the shape of each acquired 2D data set. This problem is solved in this embodiment of the invention by shifting the readout gradient pulse 206 with respect to the RF excitation pulse 204 each time the z axis phase encoding pulse 212 is stepped. During the scan the readout gradient pulse 206 is thus shifted through a succession of positions indicated by dashed lines 214, and the NMR echo signals 210 that are acquired are similarly shifted to a succession of positions indicated by dashed lines 216. The shift ($\Delta T$) in echo time is selected such that the area under the readout gradient ($G_z$) pulse 206 over this time shift $\Delta T$ is equal to the area of the step ($\Delta G_z$) in the z axis phase encoding gradient pulse 212:

$$\Delta G_z\, T_{212} = G_x\, \Delta T.$$

where $t_{212}$ is the time duration of the rephasing pulse 212. This shift ($\Delta T$) in the echo signal acquisition time effectively frequency encodes the NMR signals for each 2D slice differently. This "virtual" frequency encoding along the slab select gradient axis is affected by inhomogeneities in the polarizing magnetic field $B_0$, and as a result, the selected 2D slices are shaped the same as the selected slab. As illustrated in FIG. 7, the 2D slices 16 are thus contiguous with the boundaries 18 of the selected slabs 20 and there are no gaps in the acquired three-dimensional NMR data set, and hence, no image artifacts.

Figure 6:
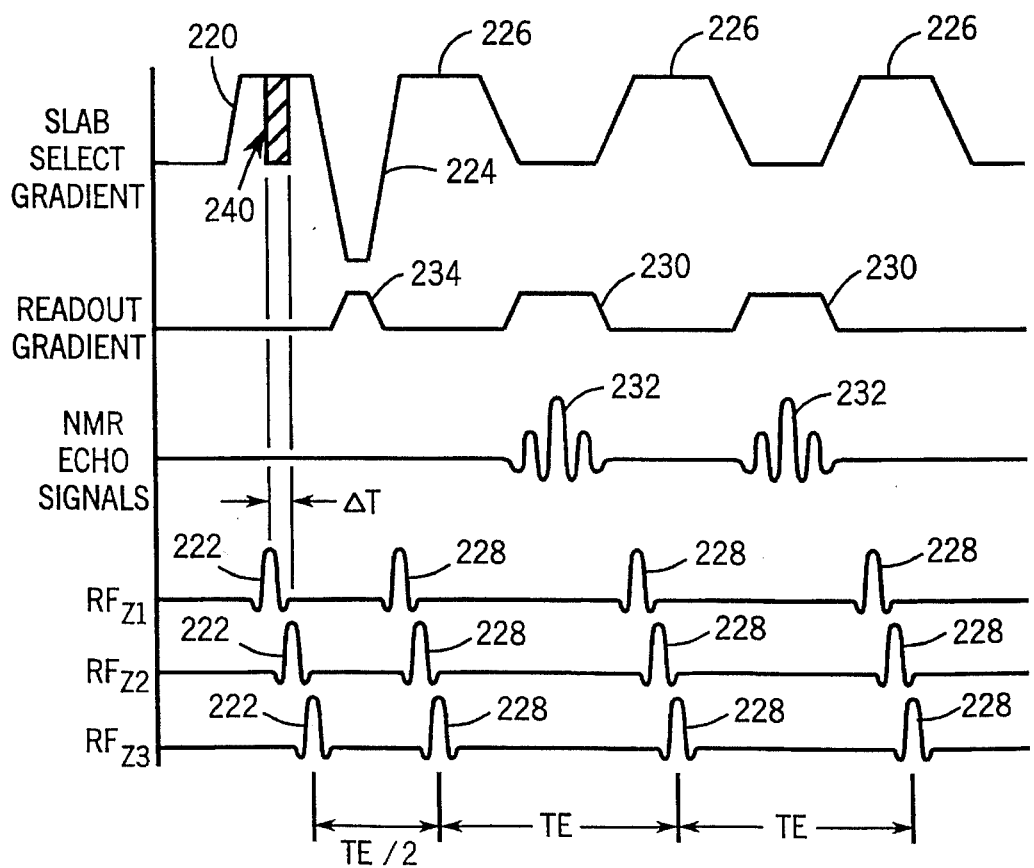
FIG. 6 is a graphic representation of a fast spin echo pulse sequence which practices another preferred embodiment of the invention.

The second embodiment of the invention employs the fast spin echo pulse sequence illustrated in FIG. 6. A detailed description of a fast spin echo pulse sequence is described in U.S. Pat. No. 5,378,985 entitled "*Fast Spin Echo Prescan For MRI*" which is incorporated herein by reference. This pulse sequence includes a slab select gradient $G_z$ which is applied at 220 during the application of a 90° selective RF excitation pulse 222. This is followed by a negative rephasing gradient pulse 224 having an area that rephases spin when the RF excitation pulse 222 is aligned with the center of the slab select gradient pulse 220. As will be described below, when practicing the present invention the alignment of the RF excitation pulse 222 is shifted during the scan, and this imparts z axis phase encoding to the spins to select slice locations within the slab as described in the above-cited U.S. Pat. No. 4,431,968.

After the rephasing gradient pulse 224, the first of a series of eight slab select gradient pulses 226 are applied along with a corresponding series of selective 180° RF refocusing pulses 228. The spacing between centers of the slab select pulses is the desired echo spacing (ESP) and the spacing between slab select pulses 220 and 226 is one-half the echo spacing (ESP/2). The same spacing (ESP) is maintained between RF refocusing pulses 228 and the spacing ESP/2 is maintained between the RF excitation pulse 222 and first RF refocusing pulse 228. Although the RF pulse train is systematically shifted in time as will be described in more detail below. This spacing and the Carr-Purcell-Meiboom-Gill (e.g. CPMG) conditions for a fast spin echo sequence are always maintained. The widths of the slab select gradient pulses 220 and 226 are such that the RF pulses 222 and 224 are always played out in the presence of the slab select gradient $G_z$ despite the shifting of the RF pulses during the scan. The bandwidths of the selective RF pulses 222 and 228 are set to select the entire slab thickness (e.g. 8 mm).

Readout gradient pulses 230 are applied during the intervals after each slab select gradient pulse 226. As a result, NMR echo signals 232 are produced and acquired by sampling during each readout gradient pulse 230. These samples (e.g. 256 samples) provide one line of NMR data along the $k_x$ axis of k-space. A dephasing readout gradient pulse 234 is applied prior to the first RF refocusing pulse 228 to shift the initial sampling along the readout axis to negative $k_x$-space. Phase encoding pulses $G_y$ (not shown in the drawings) are also applied in a conventional manner before each readout gradient pulse 230, and a corresponding rewinder gradient pulse $-G_y$ is applied after each readout gradient pulse. The phase encoding pulses $G_y$ are stepped through their set of values (e.g. 128 values) in the conventional manner to scan k-space along the $k_y$ axis for each 2D slice of acquired NMR data.

Phase encoding along the slab select gradient $G_z$ is achieved according to this embodiment of the invention by shifting the RF pulse trains by $\Delta T$. The time shift $\Delta T$ is selected such that the resulting change in accumulated phase corresponding to cross hatched area 240 results in the desired spacing (e.g. 1.0 mm) between 2D image slices within the excited slab. For each 2D slice of NMR data to be acquired during the scan, the RF pulse trains 222 and 228 are shifted by an amount $\Delta T$. Alignment of the RF pulses 222 and 228 for three 2D slices located at Z1, Z2 and Z3 is illustrated in FIG. 6, although additional 2D slices may be obtained, but are not illustrated.

It should be apparent that the shift ($\Delta T$) of the RF pulses 222 and 228 changes the time interval between each RF refocusing pulse 228 and the following NMR echo signal 232. This is because the timing of the readout gradient pulses 230 remains fixed during the entire scan. As with the first embodiment of the invention described above, this change in timing ($\Delta T$) between RF pulse and its corresponding NMR echo signal, separately frequency encodes the NMR echo signals for each 2D slice. This virtual frequency encoding is affected by the inhomogeneities in the polarizing magnetic field $B_0$ and the resulting selected 2D slices are shaped the same as the selected slab as illustrated in FIG. 7.

We claim:

1. A method for producing an image from NMR data acquired from a region of interest, the steps comprising:
   a) applying a polarizing magnetic field to the region of interest;
   b) applying an RF excitation pulse which produces transverse magnetization of spins in the region of interest;
   c) applying a first magnetic field pulse having a gradient directed along one image axis;
   d) applying a second magnetic field pulse having a gradient directed along a second image axis and perpendicular to the first image axis at a set time interval after applying said RF excitation pulse;
   e) acquiring an NMR signal during the application of said second magnetic field pulse to produce a set of signal samples along one dimension of k-space;
   f) repeating steps a) through e) with an incremental change in the applied first magnetic field pulse and an incremental shift ($\Delta T$) in the set time interval between the RF excitation pulse and the second magnetic field pulse to thereby acquire additional sets of signal samples that define a second dimension of k-space; and
   g) producing an image by Fourier transforming the sets of signal samples along each of said first and second dimensions of k-space.

2. The method as recited in claim 1 in which the RF excitation pulse is a selective pulse and a slab select pulse having a gradient directed along said one image axis is applied concurrently with the selective RF excitation pulse.

3. The method as recited in claim 1 in which the incremental change ($\Delta T$) is accomplished by shifting the time at which the RF excitation pulse is applied.

4. The method as recited in claim 1 in which the incremental change ($\Delta T$) is accomplished by shifting the time at which the second magnetic field pulse is applied.

5. The method as recited in claim 1 in which the RF excitation pulse is a selective pulse and a portion of said first magnetic field pulse is applied during the application of said selective RF excitation pulse.

6. A method for producing an image from NMR data acquired from a region of interest, the steps comprising:
   a) applying a polarizing magnetic field to the region of interest;
   b) applying a first magnetic field having a gradient directed along one image axis, said first magnetic field being applied as a first gradient pulse separated from a set of second gradient pulses by a time period, and the gradient pulses in the set of second pulses are separated from each other by one-half of said time period;
   c) applying a second magnetic field having a gradient directed along a second image axis and including a set of third gradient pulses applied after corresponding ones of said second gradient pulses and separated from each other by said time period;
   d) producing a train of RF pulses including an RF excitation pulse produced during the application of said first gradient pulse, followed by a set of refocussing RF pulses produced during the application of successive ones of said second gradient pulses, the RF excitation pulse being separated by one-half of said time period from the first refocussing RF pulse, and each of the refocussing RF pulses being separated by said time period from each other;
   e) acquiring an NMR signal during the application of each of said third gradient pulses to produce a set of signal samples along one dimension of k-space;
   f) repeating steps a) through e) with an incremental shift ($\Delta T$) in the train of RF pulses to acquire additional sets of signal samples that define a second dimension of k-space; and
   g) producing an image by Fourier transforming the sets of signal samples along each of said first and second dimensions of k-space.

7. The method as recited in claim 6 in which each of the RF pulses in the train is a selective RF pulse.

8. The method as recited in claim 6 in which the RF excitation pulse has a flip angle of substantially 90° and the refocusing RF pulses each have a flip angle of substantially twice that of the RF excitation pulse.

9. The method as recited in claim 6 in which a third magnetic field having a gradient directed along a third image axis is applied as a fourth gradient pulse prior to the application of each of said third gradient pulses, to phase encode acquired signals along a third dimension of k-space.

\* \* \* \* \*